United States Patent
Sze et al.

(10) Patent No.: US 8,604,951 B2
(45) Date of Patent: Dec. 10, 2013

(54) SYSTEM AND METHOD FOR OPTIMIZING CONTEXT-ADAPTIVE BINARY ARITHMETIC CODING

(75) Inventors: Vivienne Sze, Toronto (CA); Anantha P. Chandrakasan, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/253,915

(22) Filed: Oct. 5, 2011

(65) Prior Publication Data

US 2012/0086587 A1    Apr. 12, 2012

Related U.S. Application Data

(60) Provisional application No. 61/390,129, filed on Oct. 5, 2010.

(51) Int. Cl.
*H03M 7/00*    (2006.01)

(52) U.S. Cl.
USPC .............................................. 341/107; 341/50

(58) Field of Classification Search
USPC ....................... 347/106, 107, 50, 51
See application file for complete search history.

(56) References Cited

U.S. PATENT DOCUMENTS

| | | | | |
|---|---|---|---|---|
| 7,535,387 B1 * | 5/2009 | Delva | .............................. | 341/107 |
| 8,335,385 B2 * | 12/2012 | Strom et al. | .................. | 382/232 |
| 2005/0074176 A1 | 4/2005 | Marpe et al. | | |
| 2005/0232501 A1 | 10/2005 | Mukerjee | | |
| 2006/0028359 A1 * | 2/2006 | Kim et al. | ......................... | 341/50 |
| 2006/0220927 A1 * | 10/2006 | Park | ............................... | 341/50 |
| 2007/0080832 A1 | 4/2007 | Yang et al. | | |
| 2011/0320916 A1 * | 12/2011 | Natuzzi et al. | ................ | 714/780 |
| 2012/0022861 A1 * | 1/2012 | Imthurn et al. | ............... | 704/229 |

FOREIGN PATENT DOCUMENTS

WO    WO2012/048053 A3    4/2012

OTHER PUBLICATIONS

Detlev Marpe, Heiko Schwarz and Thomas Wiegand; Context-Based Adaptive Binary Arithmetic Coding in the H.264/AVC Video Compression Standard; IEEE Transactions on Circuits and Systems for Video Technology, vol. 13, No. 7, Jul. 2003, pp. 620-636.

Detlev Marpe, Thomas Wiegand; A highly efficient multiplication-free binary arithmetic coder and its application in video coding, in IEEE International Conference on Image Processing, vol. 2, Sep. 2003, pp. II-263-II-266 vol. 3.

* cited by examiner

*Primary Examiner* — Peguy Jean Pierre

(74) *Attorney, Agent, or Firm* — Peter A. Nieves; Sheehan Phinney Bass + Green PA

(57) ABSTRACT

A system and method is provided for ordering intervals rLPS and rMPS of a range to increase speed of binary symbol decoding in a binary arithmetic decoder. The method comprises the steps of: placing rLPS at a bottom of the range; enabling subtraction for rMPS to occur in parallel with comparison of rLPS and offset; and, reducing time that it takes to decode a bin. A method is also provided for performing context selection for a given syntax element, comprising the steps of: first, comparing information regarding properties of neighboring pixels with a threshold; second, adding results of threshold comparison of neighboring pixels, to provide a secondary result; and using the secondary result to select a context.

17 Claims, 12 Drawing Sheets

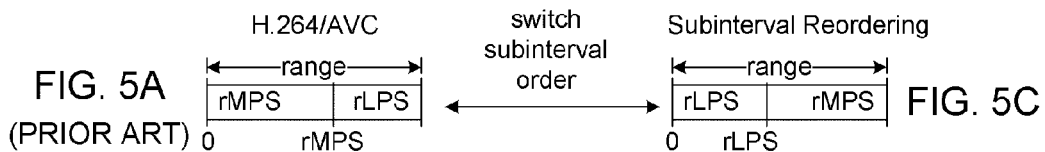
FIG. 5A (PRIOR ART)
FIG. 5C
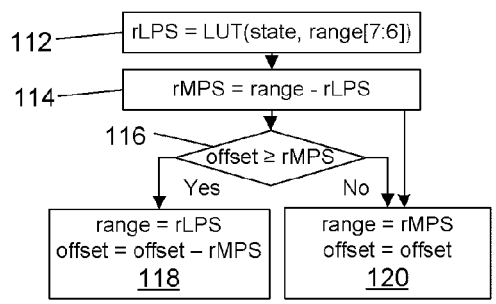
FIG. 5B (PRIOR ART)
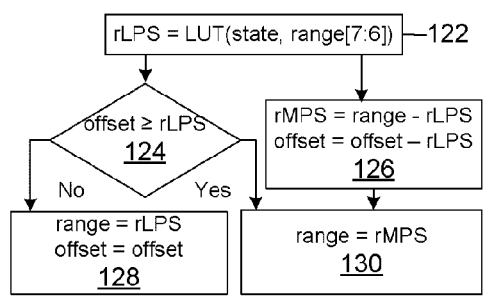
FIG. 5D
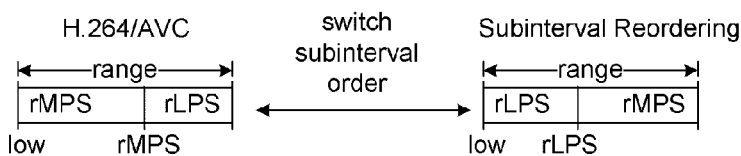
FIG. 6A (PRIOR ART) / FIG. 6B
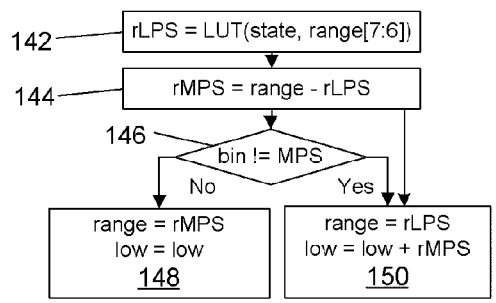
FIG. 6A (PRIOR ART)
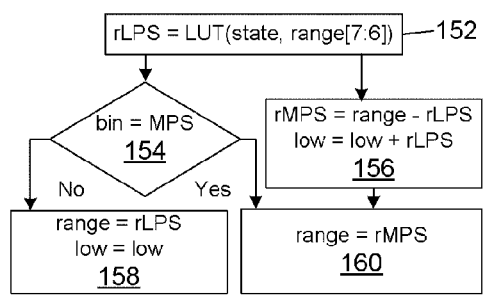
FIG. 6B

SYSTEM AND METHOD FOR OPTIMIZING CONTEXT-ADAPTIVE BINARY ARITHMETIC CODING

CROSS-REFERENCE TO RELATED APPLICATION

This application claims priority to copending U.S. Provisional Application entitled, "BINARY ARITHMETIC ENCODER AND DECODER," having patent application Ser. No. 61/390,129, filed Oct. 5, 2010, which is entirely incorporated herein by reference.

GOVERNMENT SUPPORT

This invention was made with Canadian government support under Grant Number F3920201 awarded by the Natural Sciences and Engineering Research Council of Canada. The government has certain rights in this invention.

FIELD OF THE INVENTION

The present invention relates to video coding, and particularly, to optimizing context-adaptive binary arithmetic coding.

BACKGROUND OF THE INVENTION

Entropy coding delivers lossless compression at the last stage of video encoding (and first stage of video decoding), after the video has been reduced to a series of syntax elements. Arithmetic coding is a type of entropy coding that can achieve compression close to the entropy of a sequence by effectively mapping the symbols (i.e., syntax elements) to codewords with a non-integer number of bits. In H.264/AVC, the CABAC provides a 9 to 14% improvement over the Huffman-based Context-based Adaptive Variable Length Coding (CAVLC).

CABAC involves three main functions: binarization, context modeling, and arithmetic coding. Binarization maps syntax elements to binary symbols (bins). Context modeling estimates the probability of the bins, and arithmetic coding compresses the bins.

Arithmetic coding is based on recursive interval division. Binary arithmetic coding refers to the case where the alphabet of the symbol is restricted to zero and one (i.e., binary symbols (bins)). The size of the subintervals is determined by multiplying the current interval by the probabilities of the bin. At the encoder, a subinterval is selected based on the value of the bin. The range and lower bound of the interval are updated after every selection. At the decoder, the value of the bin depends on the location of the offset. The offset is a binary fraction described by the encoded bits received at the decoder. The range and lower bound of the current interval have limited bit-precision, so renormalization is required whenever the range falls below a certain value to prevent underflow.

FIG. 1A is a schematic diagram illustrating a general structure of a CABAC engine 500. As shown by FIG. 1A, the CABAC engine 500 contains an arithmetic decoder 502, a debinarizer 504, and a context modeling unit 506, having a context memory and a context selection unit therein.

A flowchart of a presently known arithmetic decoder is shown in FIG. 1B. The range, offset, and the selected context, described by its current state and most probable symbol (MPS), and inputs to block 4. In block 4, the size of the subintervals is calculated; specifically, the range of the least probable symbol (rLPS), and the range of the most probable symbol (rMPS).

The CABAC engine used in H.264/AVC leverages a modulo coder (M coder) to calculate the range of a subinterval based on the product of the current range and the probability of the bin. The M coder involves using a look up table (LUT) rather than a true multiplier to reduce implementation complexity. In block 4, the 6-bit context state and two bits from the range are used as input to a look up table (LUT) in order to determine the rLPS. The rMPS is then determined by subtracting the rLPS from the range. rMPS is then passed to block 6, where rMPS is compared to the offset.

In block 6, if offset is greater than or equal to rMPS, then the next block is 8, where the decoded bin is determined to be not equal MPS, or in other words equal to least probable symbol (LPS). In block 8, the offset value is also updated by subtracting rMPS from it, and the range is updated by setting it equal to rLPS. After block 8, the next block is 12 where the state is compared to 0. If the state is equal to zero, then the next block is 14 where the MPS value is updated to equal 1 minus MPS (i.e., the values of MPS and LPS are swapped). After block 14, the next step is 16. If in block 12, state is not equal to 0, then the next step is directly to block 16. In block 16, the state is updated using a 64×1 LUT.

In block 6, if offset is not greater than or equal to rMPS, then the next block is 10, where the decoded bin is determined to be equal to MPS, the range is updated to be equal to rLPS, the state is updated using a 64×1 LUT. The MPS value is not updated.

The next step for both block 10 and 16 is block 18. The updated range and offsets are renormalized. Renormalization involves determining the number of leading zeros in the updated range value and shifting to the left. The updated offset is shifted by the same amount. The output of block 18 is the renormalized range and offset; the updated state and MPS are also the output of the binary arithmetic decoder.

The arithmetic coding engine typically contains the critical path in H.264/AVC CABAC. Unfortunately, there are delays in the critical path.

In order to achieve optimal compression efficiency, an accurate probability must be used to code each bin. For High profile in H.264/AVC, CABAC uses over 400 different probability models to achieve the significant coding gains over CAVLC. All bins of the same type (i.e., with the same probability distribution and characteristics) are grouped together in a context and use the same model. Accordingly, the context of a bin dictates the probability with which it is coded.

Since distributions in neighboring macroblocks are correlated, the value of the syntax elements of the macroblocks (or blocks) located to the top and left impact the context selection. For instance, bins of motion vector difference (mvd) syntax elements that have neighbors with large mvds, use the same context. Unfortunately, using information from the top and left neighbor requires additional memory, which adds to area cost of context modeling.

Thus, a heretofore unaddressed need exists in the industry to address the aforementioned deficiencies and inadequacies.

SUMMARY OF THE INVENTION

Embodiments of the present invention provide a system and method for optimizing content-adaptive binary arithmetic coding. Briefly described, in architecture, one embodiment of the method, among others, can be implemented as follows. A method is provided for ordering intervals rLPS and rMPS of a range to increase speed of binary symbol decoding in a binary arithmetic decoder. The method comprises the steps of: placing rLPS at a bottom of the range; enabling subtraction for rMPS to occur in parallel with comparison of rLPS and offset; and, reducing time that it takes to decode a bin. Equivalent structure is also provided for a binary arithmetic encoder.

The present invention also provides a method of performing context selection for a given syntax element, comprising the steps of: first, comparing information regarding properties of neighboring pixels with a threshold; second, adding results of threshold comparison of neighboring pixels, to provide a secondary result; and using the secondary result to select a context.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 5 is a schematic diagram illustrating the difference between the range order of H.246/AVC CABAC and subinterval reordering for CABAC decoding.

FIG. 6 is a schematic diagram illustrating the difference between the range order of H.246/AVC CABAC and subinterval reordering for CABAC encoding.

DETAILED DESCRIPTION

The present invention focuses on reducing the critical path delay of the arithmetic coding engine as well as reducing the area cost of context modeling.

The present invention provides a binary arithmetic encoder and decoder. While the following provides the example of a binary arithmetic decoder, one having ordinary skill in the art would appreciate that the present application also pertains to a binary arithmetic encoder, which would have similar structure. The same application must be applied to the encoder in order for encoder/decoder match, specifically, in order for the decoder to be able to decompress what was encoded by the encoder.

In general, regarding the decoder, a method is provided for ordering intervals rLPS and rMPS of a range by placing rLPS at the bottom of the range rather than at the top, which enables the subtraction for rMPS to occur in parallel with the comparison of rLPS and offset, and reduces the time it takes to decode a bin (i.e., speeds up the binary symbol decoding process in the binary arithmetic decoder). In addition, regarding the encoder, a method is provided for ordering the intervals rLPS and rMPS of the range by placing rLPS at the bottom of the range rather than at the top, which enables the subtraction for rMPS to occur in parallel with the comparison of the bin to be encoded and MPS, and reduces the time it takes to encode a bin (i.e., speeds up the binary symbol encoding process in the binary arithmetic encoder).

It should be noted that a range is defined as the size of the current interval that is divided into subintervals based on the probability of the bins. The range is updated after every bin is encoded or decoded and requires renormalization to prevent underflow. In addition, MPS represents the most probable symbol, and LPS represents the least probable symbol, while rMPS represents the MPS subinterval and rLPS represents the LPS subinterval.

Figure 1A:
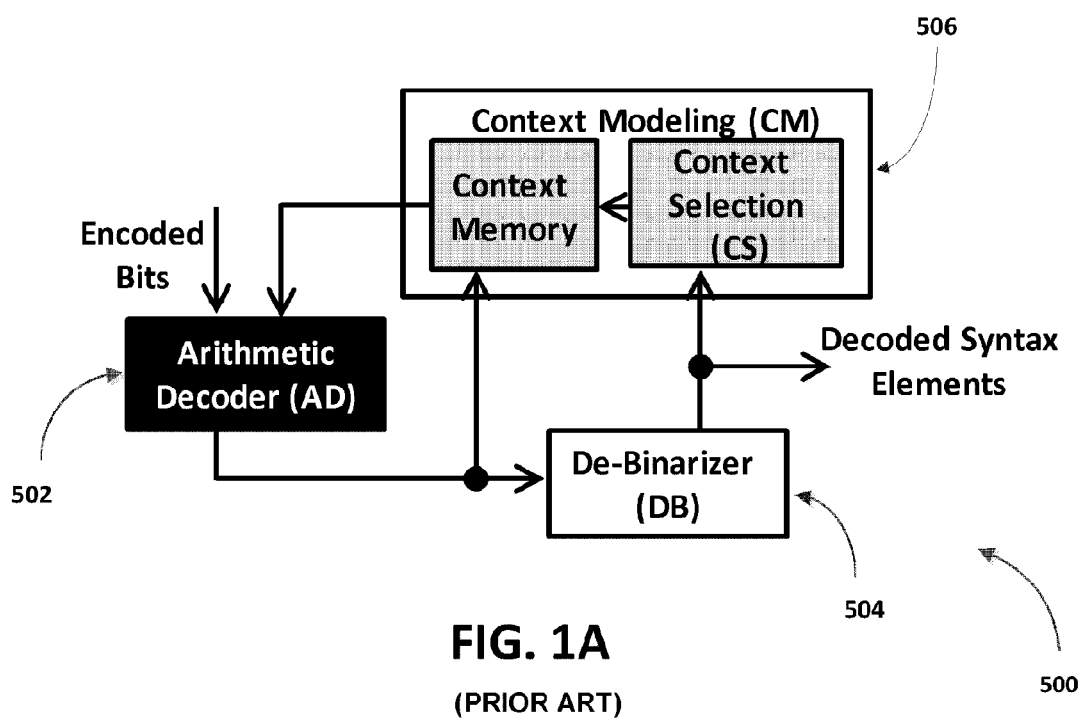
FIG. 1A is a schematic diagram illustrating a general structure of a CABAC engine.
Figure 1B:
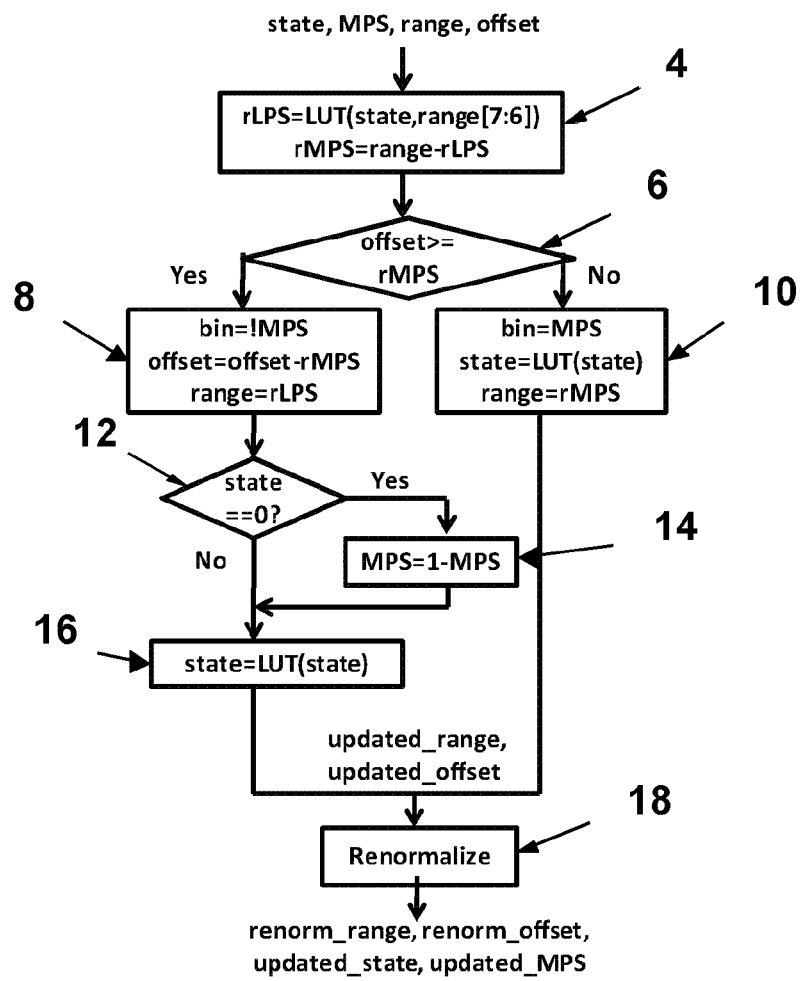
FIG. 1B is a flowchart of a prior art arithmetic decoder.
Figure 2:
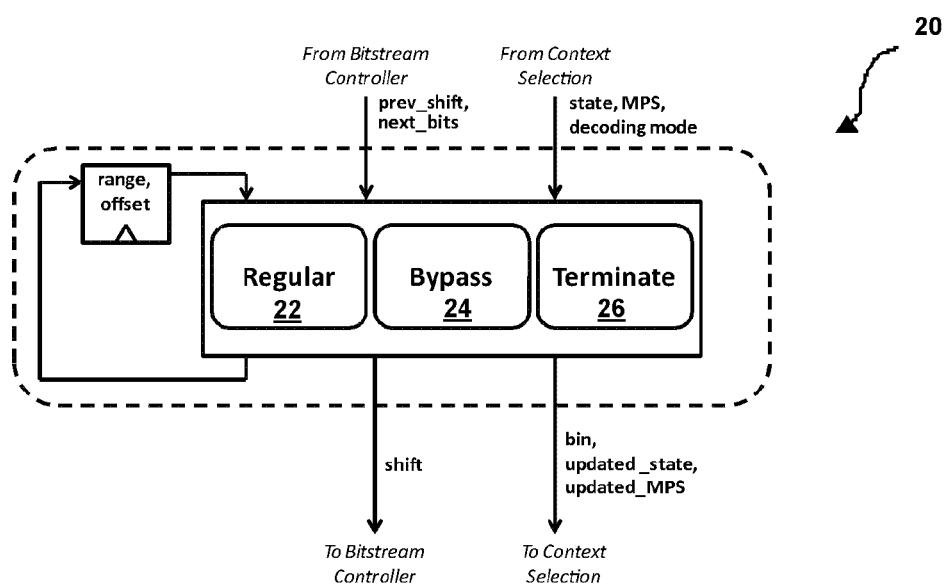
FIG. 2 is a schematic diagram illustrating a general architecture of the present binary arithmetic decoder, having a regular coding portion, a bypass coding portion, and a terminate coding portion.

FIG. 2 shows a general architecture of the present binary arithmetic decoder 20, having a regular coding portion 22, a bypass coding portion 24, and a terminate coding portion 26. Modification in accordance with the present invention is provided within the regular coding portion 22 of the arithmetic decoder 20. The inputs to the arithmetic decoder 20 include current context state (and most probable symbol (MPS)), next bits, number of next bits (previous shift), and decoding mode. The outputs include updated context state (and MPS), decoded bin and number of shifted bits due to renormalization. The range and offset are stored as internal states.

The following provides the example of using the present binary arithmetic decoder for Context-adaptive binary arithmetic coding (CABAC). It should be noted, however, that the present binary arithmetic encoder and decoder is not limited in use to CABAC.

CABAC uses three arithmetic coding modes: regular, bypass, and terminate, which are represented as modules 22, 24, 26, respectively in FIG. 2. Bypass and terminate do not require context models and thus have a simpler data flow.

Figure 3:
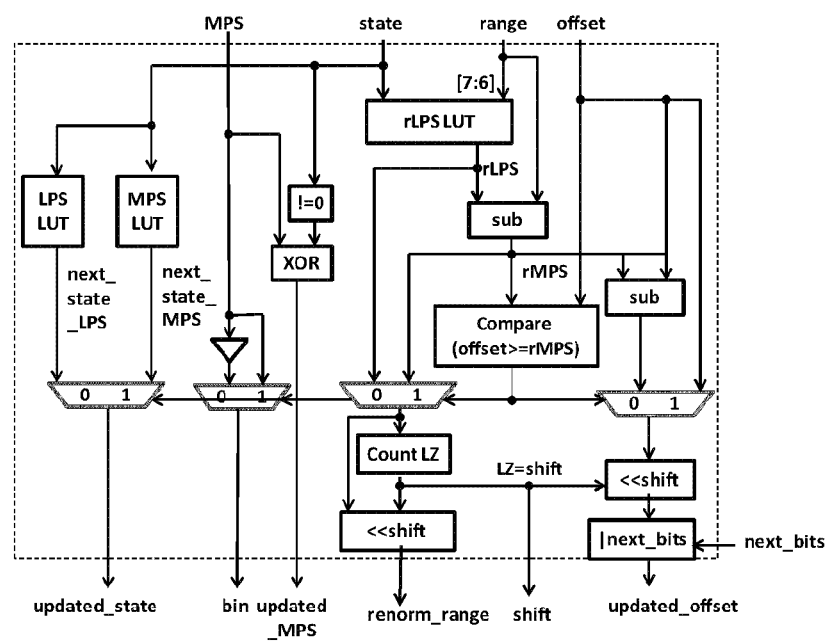
FIG. 3 is a schematic diagram illustrating a general architecture for the regular mode in a binary arithmetic decoder, in accordance with the prior art.
Figure 4:
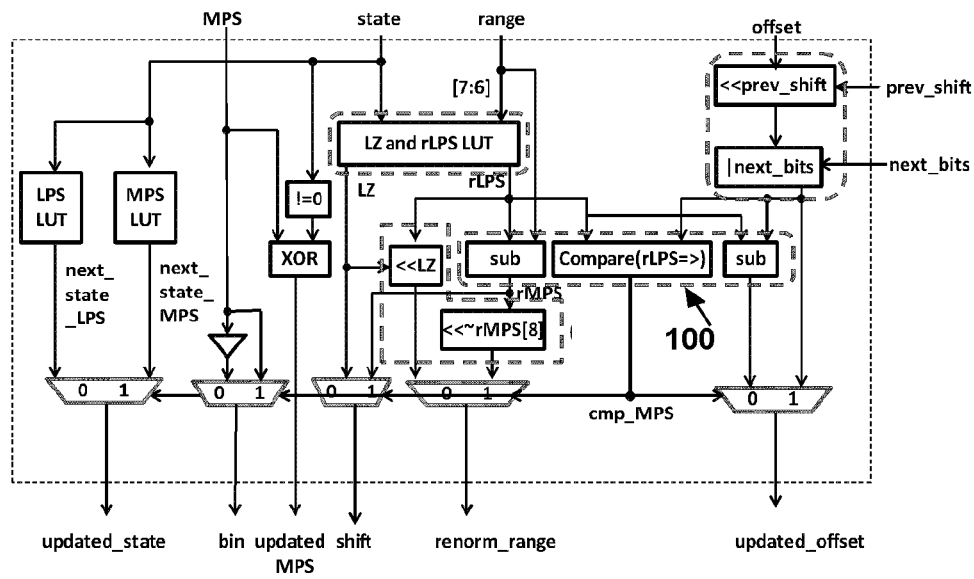
FIG. 4 is a schematic diagram illustrating a modified architecture for the regular mode in a binary arithmetic decode, in accordance with the present invention.

The critical path lies in the regular mode as it uses the context models. FIG. 3 shows a general architecture for the regular mode in a binary arithmetic decoder, in accordance with the prior art. In accordance with the present invention, one major optimization is performed on the architecture to increase concurrency and shorten the critical path as shown in the modified architecture illustrated by FIG. 4. The impact of this optimization is a substantial reduction in critical path delay. The following describes this key modification, which is illustrated as number 100 is FIG. 4.

Range Comparison Reordering

In H.264/AVC, the rMPS is compared to the offset to determine whether the bin is MPS or least probable symbol (LPS). The rMPS interval is computed by first obtaining rLPS from a 64×4 look up table (LUT) (using bits [7:6] of the current 9-bit range and the 6-bit probability state from the context) and then subtracting it from the current range. The LUT contains constant values and is implemented with multiplexers. Depending on whether an LPS or MPS is decoded, the range is updated with their respective intervals. To summarize, the range division steps in the arithmetic decoder are:
1. obtain rLPS from the 64×4 LUT;
2. compute rMPS by subtracting rLPS from current range;
3. compare rMPS with offset to make bin decoding decision; and
4. update range based on bin decision.

If the offset was compared to rLPS rather than rMPS, then the comparison and subtraction to compute rMPS can occur at the same time. FIG. 5 shows the difference between the range order of H.246/AVC CABAC and MP-CABAC for CABAC decoding. Alternatively, FIG. 6 illustrates the same for CABAC encoding. Referring to FIG. 5, the two orderings of the intervals (i.e., which interval begins at zero, as illustrated in FIG. 5A and FIG. 5B) are mathematically equivalent in arithmetic coding and thus changing the order has no impact on coding efficiency. With this change, the updated offset is computed by subtracting rLPS from offset rather than rMPS. Since rLPS is available before rMPS, this subtraction can also be done in parallel with range-offset comparison as shown in FIG. 5D, which could not be done without the reordering as shown in FIG. 5C.

Changing the order of rLPS and rMPS requires the algorithm to be modified and is not H.264/AVC standard-compliant (i.e., it is a modification for the next generation standard). There is no coding penalty for this change.

FIG. 5B shows a flowchart of the prior art. In block 112, the 6-bit context state and two bits from the range are used as input to an LUT in order to determine the rLPS. The next step is block 114, where rMPS is determined by subtracting the rLPS from the range. rMPS is then passed to block 116, where rMPS is compared to the offset. If the offset is greater than or equal to rMPS, the next step is block 118, where the range is updated to equal rLPS and offset is updated by subtracting rMPS from the current offset value. If in block 116, offset is not greater than or equal to rMPS, the next step is block 120, where the range is updated to equal rMPS and the offset is unchanged.

FIG. 5D shows the flowchart of the invention of subinterval reordering. In block 122, the 6-bit context state and two bits from the range are used as input to an LUT in order to determine the rLPS. The next step has block 124 and block 126 running in parallel. In block 124, rLPS from block 122, can be immediately used and is compared to the offset, while in block 126, rMPS is determined by subtracting the rLPS from range; in block 126, offset is also updated by subtracting rLPS from the current offset. If in block 124, the offset is greater than or equal to rLPS, the next step is block 130, where range is updated to equal rMPS and offset is obtained from block 126. If in block 124, offset is not greater than or equal to rMPS, the next step is block 128, where the range is updated to equal rLPS and the offset is unchanged.

FIG. 6A shows the prior art for the arithmetic encoder in the CABAC, while FIG. 6B show the present invention applied to CABAC encoding. FIG. 6A shows a flowchart of the prior art. In block 142, the 6-bit context state and two bits from the range are used as input to an LUT in order to determine the rLPS. The next step is block 144, where rMPS determined by subtracting the rLPS from the range. rMPS is then passed to block 146, where it determines whether the bin is equal to MPS. If the bin is equal to MPS, the next step is block 148, where range is updated to equal rMPS and low is unchanged. If in block 146, the bin is not equal to MPS, the next step is block 150, where the range is updated to equal rLPS and the low is updated by added rMPS to the current low.

FIG. 6B shows the flowchart of the invention of subinterval reordering for encoding. In block 152, the 6-bit context state and two bits from the range are used as input to an LUT in order to determine the rLPS. The next step has block 154 and block 156 running in parallel. In block 154, the bin is compared with MPS. In block 156, rMPS is computed by subtracting rLPS from range and low is update by adding rLPS to the current low. If in block 154, the bin is equal to MPS, then the next step is block 160, and range is updated to be equal to rLPS and low is obtained from block 156. If in block 154, the bin is not equal to MPS, range is update to be equal to rLPS and low is unchanged.

This optimization accounts for around an 11% reduction in critical path delay, although it should be noted that a different percentage reduction in the critical path delay may be provided.

Figures 7A, 7B:
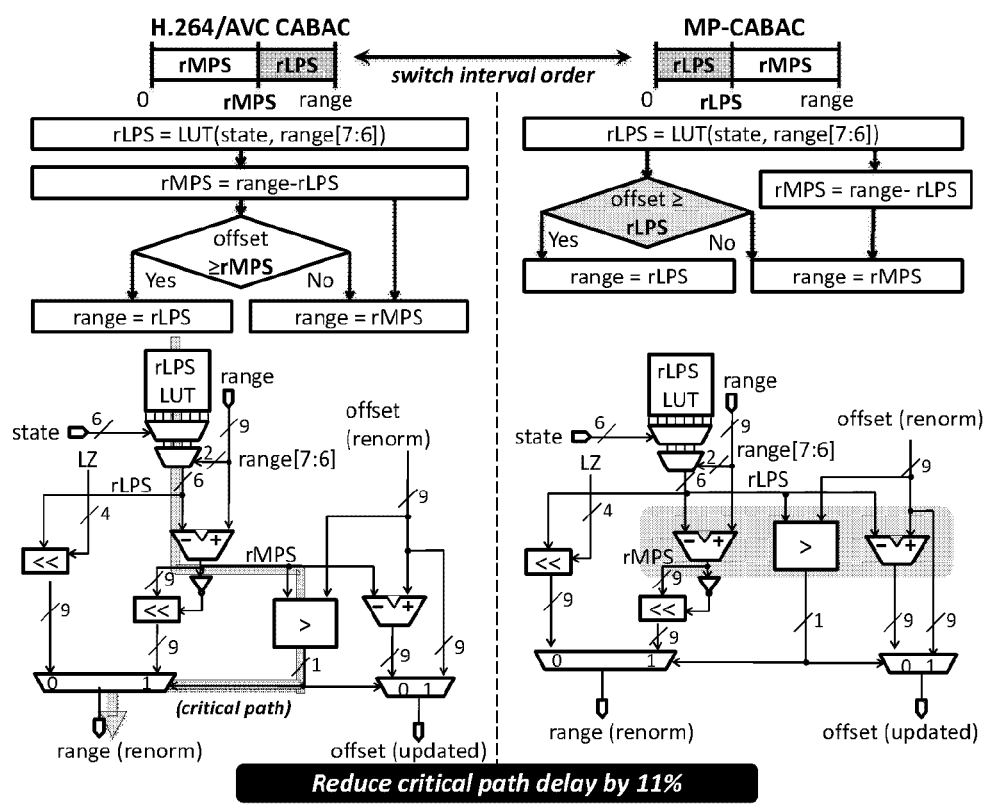
FIG. 7 is a schematic diagram illustrating an optimization architecture corresponding to the decoder of FIG. 5.

FIG. 7 is a schematic diagram illustrating an optimization architecture corresponding to the decoder of FIG. 5. FIG. 7A shows the structure for the prior art. The output of the rLPS LUT, labeled as rLPS, is connected to the arithmetic operator (i.e., subtraction) and the output of the arithmetic operator, labeled as rMPS, is connected to the comparator. The critical path is also highlighted in FIG. 7A.

FIG. 7B shows an exemplary structure for the present invention. The output of the rLPS LUT, labeled as rLPS, is connected both to the arithmetic operator (i.e. subtraction) and the comparator. Thus, in FIG. 7B, the comparator and arithmetic operator (i.e., subtraction) operate in parallel and the critical path delay is reduced.

Figure 8:
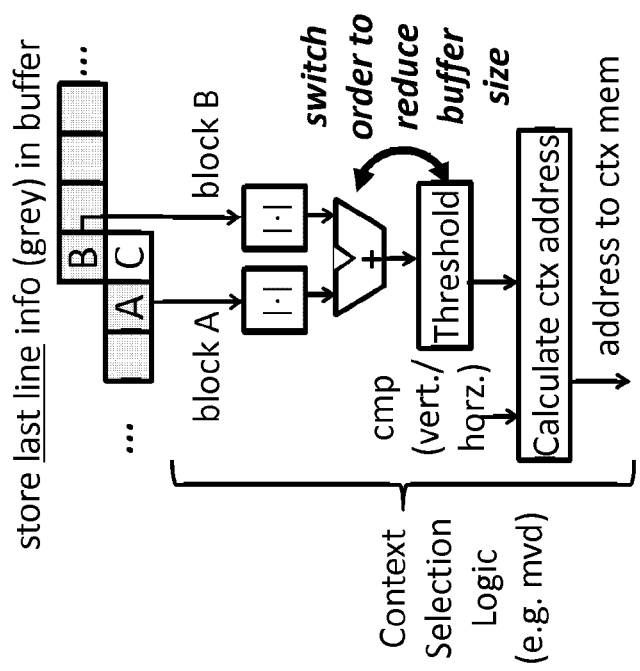
FIG. 8 shows the order of operations to calculate the context index for context selection from the neighboring information.

FIG. 8 shows the order of operations to calculate the context index for context selection from the neighboring information. Context selection for syntax elements located at position C in FIG. 8 can depend on neighboring information (e.g., left labeled as A in FIG. 8 and top labeled as B in FIG. 8). This neighboring information is also referred to as last line information. Memory is required to store this last line information which can consume significant hardware area and cost. In prior art, for syntax elements such as motion vector difference (mvd), after the absolute value is table, their sum is taken and compared to a threshold. The result of the threshold is used to calculate a context index for context selection. In this invention, the threshold is performed before the summation and the result of the summation is used to calculate a context index for context selection. The benefit is that for the last line memory can be reduced since rather than storing the original neighboring info, only the result of the threshold (1-bit) needs to be stored.

The following provides an example of an application using the present binary arithmetic decoder 20. It should be noted that the present binary arithmetic encoder and decoder is not intended to be limited in use to the following example.

Context-based Adaptive Binary Arithmetic Coding (CABAC) is a well known bottleneck in existing H.264/AVC decoders. Although CABAC provides high coding efficiency, its tight feedback loops make it difficult to parallelize and limit the overall decoder throughput. The feedback loops are tied to the binary symbol (bins); thus, the throughput and performance of the CABAC engine are measured in bins/cycle and bins/second, respectively. Speculative computation is often used to increase the throughput at the cost of increased power consumption. Unlike the rest of the video decoder which can use macroblock-line level (wavefront) parallelism, CABAC can only be parallelized across frames;

consequently, buffering is required between CABAC and the rest of the decoder which increases external memory bandwidth.

Figure 9:
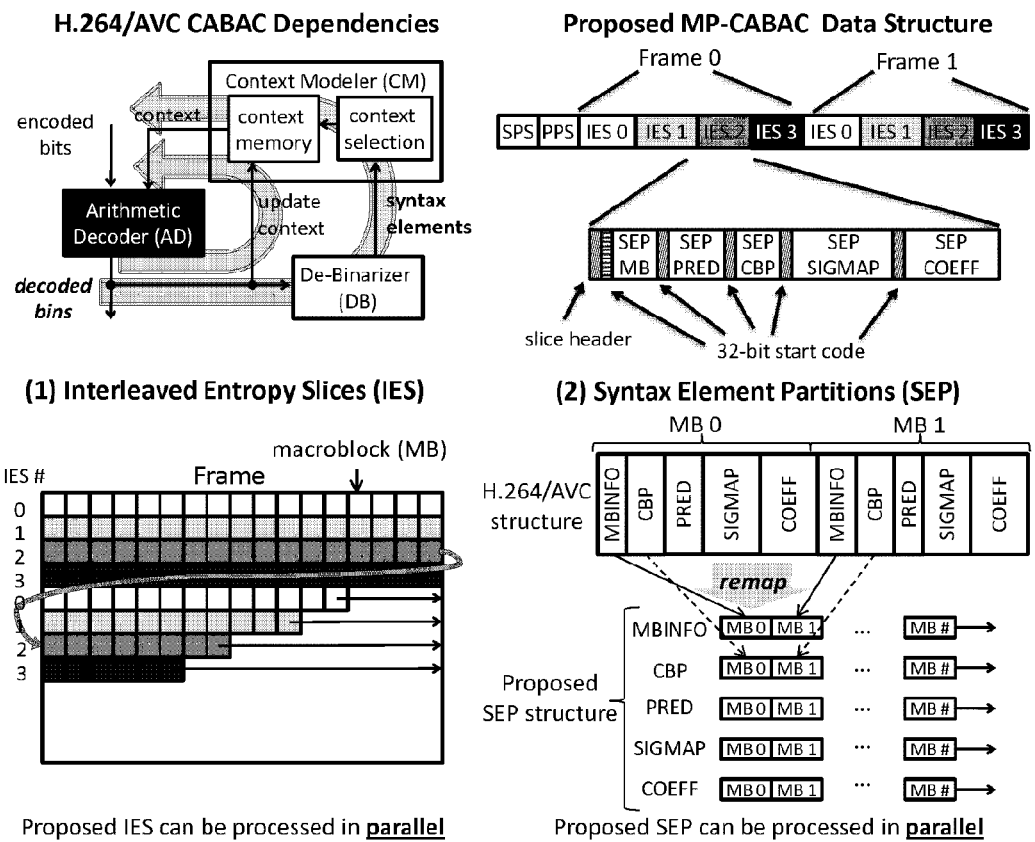
FIG. 9 is a schematic diagram illustrating two forms of parallelism.

Massively Parallel CABAC (MP-CABAC), previously developed by the authors, is currently under consideration for High Efficiency Video Coding, and has been adopted into the standard body's JM-KTA working software. It enables parallel processing, while maintaining the high coding efficiency of CABAC, by using a combination of two forms of parallelism shown in FIG. 9: interleaved entropy slices (IES) and syntax element partitions (SEP). IES enables several slices to be processed in parallel, allowing the entire decoder to achieve wavefront parallel processing without increasing external memory bandwidth. SEP enables different syntax elements (e.g., motion vectors, coefficients, etc.) to be processed in parallel with low area cost. FIG. 9 shows the MP-CABAC data structure, where each frame is composed of several IES, and each IES is composed of five SEP. The MP-CABAC test chip presented supports up to 16 IES per frame with 80 arithmetic decoders (AD) running in parallel.

Figure 10:
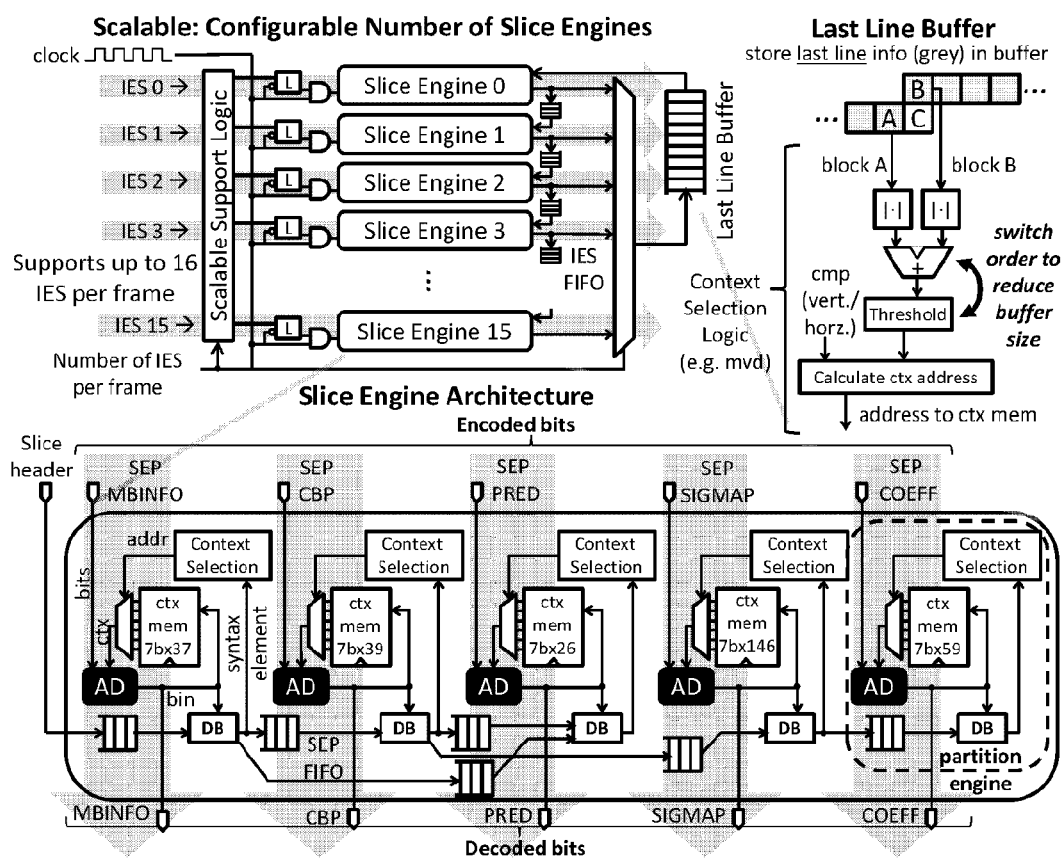
FIG. 10 is a schematic diagram illustrating several slice engines.

IES are processed in parallel by several slice engines as shown in FIG. 10. IES FIFOs are used between slice engines to synchronize IES required due to top block dependencies. The properties of the neighboring blocks (A and B) are used for context selection and are stored in the IES FIFOs and last line buffer. FIG. 10 shows a joint algorithm-architecture optimization in the context selection logic that reduces the last line buffer size by 67%. To enable scalability, the number of slice engines is configurable; a multiplexer connects the output of the last enabled slice engine to the last line buffer. To reduce power, the clocks to the disabled slice engines are turned off using hierarchal clock gating. Over 9× increase in throughput is achieved with 16 IES per frame using the architecture in FIG. 10.

SEP are processed in parallel by several arithmetic decoders (AD) within the slice engine as shown in FIG. 10. Syntax elements are assigned to five different partitions based on their workload (i.e., number of bins). The FSM of the context modeler (CM) and de-binarizer (DB) is divided into smaller FSMs for each SEP. The register-based context memory is also divided into smaller memories for each SEP. Thus, the context memory and the FSM are not replicated which keeps area cost low. The slice engine contains five different partition engines, each with a small FSM, context memory and AD. Dependencies between SEP are managed using SEP FIFOs, allowing SEP of different macroblocks to be processed concurrently. During the stall cycles, the partition engine clock is disabled with hierarchical clock gating to reduce power. Using this slice engine architecture, up to five bins can be decoded in parallel with an average throughput increase of 2.4×.

Figure 11:
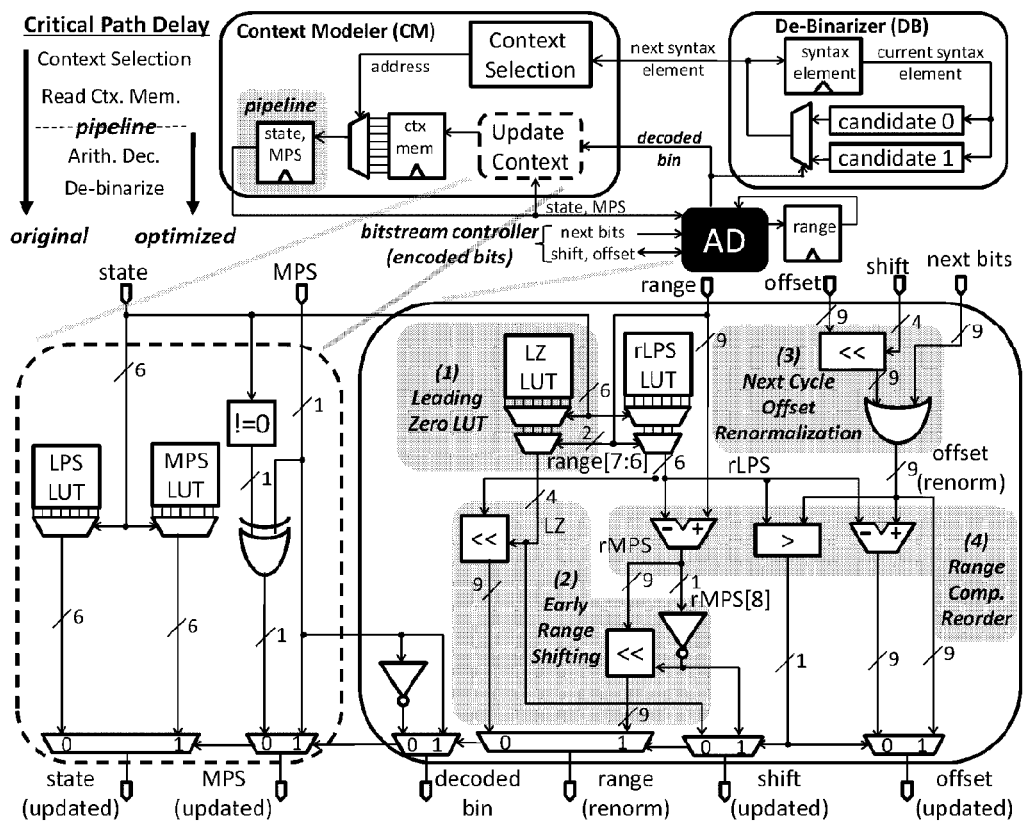
FIG. 11 shows the architecture of the partition engine in an MP-CABAC.

FIG. 11 shows the architecture of the partition engine in the MP-CABAC. CM selects the context (state, MPS) based on the syntax element being processed. AD uses this context and encoded bits from the bitstream controller to decode a bin. The bin is fed back to CM to update the context memory and to DB to compute the syntax element. Several techniques are used to reduce critical path delay. First, the engine is pipelined by inserting a register between CM and AD for a 40% reduction. Next, the critical path in AD is reduced using three optimizations: 1) Leading Zero (LZ) detection is done using a look up table (LUT) in parallel with least probable symbol interval (rLPS) LUT to speed up renormalization; 2) Early range shifting enables renormalization of rLPS to occur in parallel with the range and offset subtractions; and 3) Offset renormalization is moved to the beginning of the next cycle so that it occurs in parallel with the rLPS look up. These architectural optimizations reduce the critical path of AD by 11%, although it should be noted that a different percentage reduction in the critical path may be provided.

Finally, a joint algorithm-architecture optimization, highlighted as 4) in FIG. 11 and shown in detail in FIG. 7, further speeds up AD. Range comparison reordering changes the order of the least and most probable symbol intervals (rLPS and rMPS). Placing rLPS at the bottom of the range enables the offset comparison to occur in parallel with the subtraction for rMPS, which reduces the critical path by an additional 11% without affecting coding efficiency, although it should be noted that a different percentage reduction in the critical path may be provided.

Modified mvd Context Selection to Reduce Area Cost

To make use of the spatial correlation of neighboring data, context selection can depend on the values of the top (B) and left (A) blocks as shown in FIG. 8. Consequently, a last line buffer is required in the CABAC engine to store information pertaining to the previously decoded row. The depth of this buffer depends on the width of the frame being decoded which can be quite large for high resolution (e.g. 4 k×2 k) sequences. The bit-width of the buffer depends on the type of information that needs to be stored per block or macroblock in the previous row. The present invention reduces the bit-width of this data to reduce the overall last line buffer size of the CABAC.

Specifically, the present invention modifies the context selection for motion vector difference (mvd). mvd is used to reduce the number of bits required to represent motion information. Rather than transmitting the motion vector, the motion vector is predicted from its neighboring 4×4 blocks and only the difference between motion vector prediction (mvp) and motion vector (mv), referred to as mvd, is transmitted.

$$mvd = mv - mvp \tag{Eq. 1}$$

A separate mvd is transmitted for the vertical and horizontal components. The context selection of mvd depends on neighbors A and B as shown in FIG. 8.

In H.264/AVC, neighboring information is incorporated into the context selection by adding a context index increment (between 0 to 2 for mvd) to the calculation of the context index. The mvd context index increment, Xmvd, is computed in two steps.

Step 1: Sum the absolute value of neighboring mvds $$e(A,B,cmp) = |mvd(A,cmp)| + |mvd(B,cmp)| \tag{Eq. 2}$$

where A and B represent the left and top neighbor and cmp indicates whether it is a vertical or horizontal component.

Step 2: Compare e(A,B,cmp) to thresholds of 3 and 32

$$Xmvd(cmp) = \begin{cases} 0, & \text{if } e(A, B, cmp) < 3 \\ 1, & \text{if } 3 \le e(A, B, cmp) \le 32 \\ 2, & \text{if } e(A, B, cmp) > 32 \end{cases} \tag{Eq. 3}$$

Figure 12A:
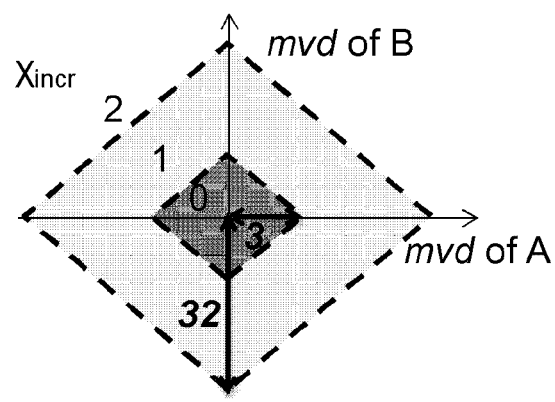
FIG. 12A illustrates how equation 3 maps the mvd of A and B to different mvd.

FIG. 12A illustrates how the above equation 3 maps the mvd of A and B to different mvd. In a given slice, all blocks surrounded by large mvds will use the same probability model (Xmvd=2). Blocks surrounded by small mvds will use another probability model (Xmvd=0 or Xmvd=1).

With the upper threshold set to 32, a minimum of 6-bits of the mvd has to be stored per component per 4×4 block in the last line buffer. For 4 k×2 k, there are (4096/4)=1024 4×4 blocks per row, which implies 6×2×2×1024=24,576 bits are required for mvd storage.

To reduce the memory size, rather than summing the components and then comparing to a threshold, the present invention separately compares each component to a threshold and sums their results. In other words, Step 1: Compare the components of mvd to a threshold $$threshA(cmp)=|mvd(A,cmp)|>16$$

$$threshB(cmp)=|mvd(B,cmp)|>16$$

Step 2: Sum the results threshA and threshB from Step 1

$$mvd(cmp)=threshA(cmp)+threshB(cmp) \quad (Eq. 4)$$

Figure 12B:
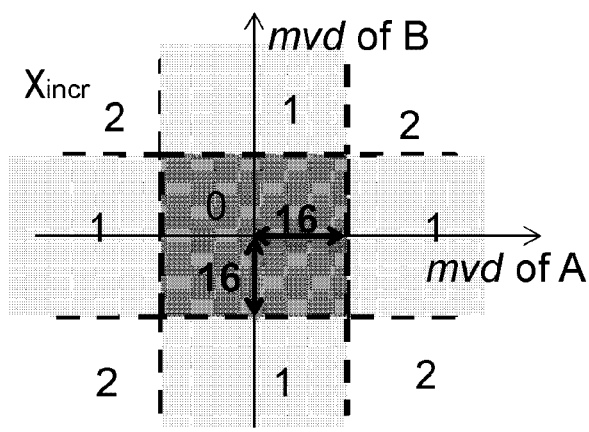
FIG. 12B illustrates how the equation 4 maps the mvd of A and B to different xmvd.

FIG. 12B illustrates how the above equation maps the mvd of A and B to different xmvd. A single threshold of 16 is used. Consequently, only a single bit is required to be stored per component per 4×4 block; the size of the last line buffer for mvd is reduced to 1×2×2×1024=4096 bits. In H.264/AVC, the overall last line buffer size of the CABAC required for all syntax elements is 30,720 bits. The modified mvd context selection reduces the memory size by 67%, from 30,720 bits to 10,240 bits. The coding penalty (measured using BD-rate) of this approach was verified across common conditions to be 0.02%.

It should be emphasized that the above-described embodiments of the present invention are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

We claim:

1. A method of ordering intervals rLPS and rMPS of a range to increase speed of decoding a binary symbol (bin) in a binary arithmetic decoder, comprising the steps of:
   placing rLPS at a bottom of the range;
   subtracting the rLPS from a provided offset; and
   comparing the provided offset to the rLPS to determine if the offset is greater than or equal to the rLPS,
   wherein the steps of subtracting and comparing are performed substantially in parallel, reducing time it takes to decode the bin.

2. The method of claim further comprising the step of:
   if the offset less than the rLPS, updating the range to the value of the rLPS, otherwise updating the range to the value of the rMPS.

3. The method of claim 1, wherein the range comprises a current interval divided into subintervals based on the probability of the bins.

4. The method of claim 3, further comprising the step of updating the range after every bin is decoded.

5. The method of claim 4, further comprising the step of renormalizing the updated range and the offset.

6. The method of claim 1, wherein the binary arithmetic decoder is configured to perform context-adaptive binary arithmetic coding (CABAC).

7. The method of claim 1, further comprising the step of obtaining the rLPS from a look up table.

8. A method of ordering intervals rLPS and rMPS of a range to increase speed of encoding a binary symbol (bin) in a binary arithmetic encoder, comprising the steps of:
   placing rLPS at a bottom of the range;
   subtracting the rLPS from a provided offset; and
   comparing the bin to a provided MPS to determine if the bin equals the MPS,
   wherein the steps of subtracting and comparing are performed substantially in parallel, reducing time it takes to encode the bin.

9. The method of claim 8, further comprising the step of:
   if the bin is not equal to the rLPS, updating the range to the value of the rLPS, otherwise updating the range to the value of the rMPS.

10. The method of claim 8, wherein the range comprises a current interval divided into subintervals based on the probability of the bins.

11. The method of claim 9, further comprising the step of updating the range after every bin is encoded.

12. The method of claim 11, further comprising the step of renormalizing the updated range and the offset.

13. The method of claim 8, wherein the binary arithmetic encoder is configured to perform context-adaptive binary arithmetic coding (CABAC).

14. The method of claim 8, further comprising the step of obtaining the rLPS from a look up table.

15. A method of performing context selection for a given syntax element, comprising the steps of:
   first, comparing information regarding properties of neighboring, pixels with a threshold, resulting in a threshold comparison;
   second, adding results of the threshold comparison of neighboring pixels, to provide a secondary result; and
   using the secondary result to select a context.

16. The method of claim 15, wherein the context selection is for a motion vector difference (mvd).

17. The method of claim 15, wherein the threshold comparison results are stored in a single bit memory.

* * * * *